United States Patent
Limpert et al.

(10) Patent No.: US 8,982,453 B2
(45) Date of Patent: Mar. 17, 2015

(54) DEVICE FOR AMPLIFYING AND/OR TRANSPORTING ELECTROMAGNETIC RADIATION

(75) Inventors: Jens Limpert, Jena (DE); Andreas Tuennermann, Weimar (DE); Damian Schimpf, Cambridge, MA (US); Tino Eidam, Jena (DE); Enrico Seise, Tautenhain (DE); Fabian Roeser, Dresden (DE)

(73) Assignees: Fraunhofer-Gesellschaft zur Foerderung der Angewandten Forschung E.V., Munich (DE); Friedrich-Schiller-Universitaet Jena, Jena (DE)

( * ) Notice: Subject to any disclaimer, the term of this patent is extended or adjusted under 35 U.S.C. 154(b) by 90 days.

(21) Appl. No.: 13/382,980

(22) PCT Filed: Jul. 9, 2010

(86) PCT No.: PCT/EP2010/004187
§ 371 (c)(1),
(2), (4) Date: May 25, 2012

(87) PCT Pub. No.: WO2011/003618
PCT Pub. Date: Jan. 13, 2011

(65) Prior Publication Data
US 2012/0229888 A1 Sep. 13, 2012

(30) Foreign Application Priority Data
Jul. 10, 2009 (DE) .......................... 10 2009 032 803

(51) Int. Cl.
*H01S 3/23* (2006.01)
*H01S 3/10* (2006.01)
(Continued)

(52) U.S. Cl.
CPC .......... *H01S 3/10061* (2013.01); *H01S 3/2308* (2013.01); *H01S 3/08054* (2013.01);
(Continued)

(58) Field of Classification Search
CPC ......................... H01S 3/10061; H01S 3/2308
USPC ............................................. 359/341.1; 372/6
See application file for complete search history.

(56) References Cited

U.S. PATENT DOCUMENTS 3,594,659 A * 7/1971 Brandli et al. ................... 372/32
4,222,011 A * 9/1980 Kurnit ............................ 330/4.5
(Continued)

FOREIGN PATENT DOCUMENTS

DE 1 076 205 2/1960
DE 1 196 255 7/1965
(Continued)

OTHER PUBLICATIONS

International Search Report of PCT/EP2010/004187, Oct. 28, 2011.
(Continued)

*Primary Examiner* — Ari M Diacou
(74) *Attorney, Agent, or Firm* — Collard & Roe, P.C.

(57) ABSTRACT

The invention relates to a laser device (1) for amplifying and/or transporting electromagnetic radiation, comprising a radiation source (2) for generating the electromagnetic radiation and an amplifier (4) for amplifying or a medium for transporting the generated electromagnetic radiation. In order to make available a device (1) for amplifying or transporting electromagnetic radiation that provides a very easy to implement possibility for reducing the influence of non-linear effects, the electromagnetic radiation propagating in the amplifier (4) or medium is largely non-linearly polarized.

12 Claims, 3 Drawing Sheets

Figure 1:
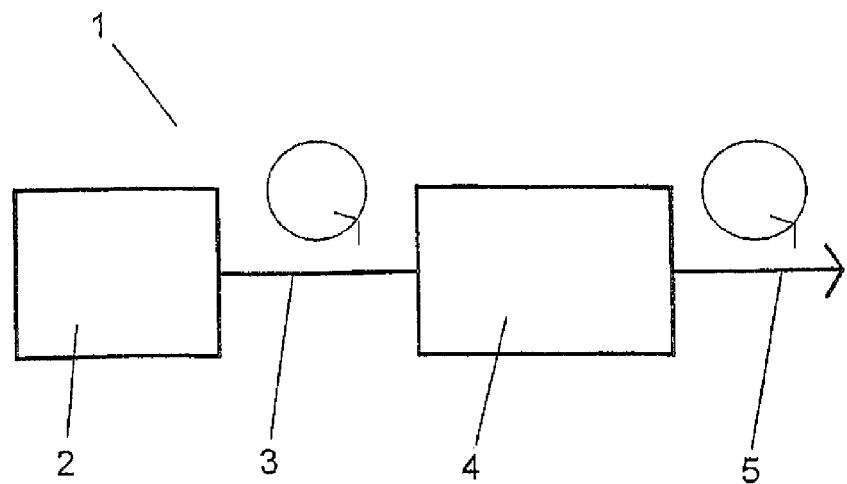

(51) Int. Cl.
 *H01S 3/08* (2006.01)
 *H01S 3/00* (2006.01)
 *G02B 6/27* (2006.01)

(52) U.S. Cl.
 CPC ........... *H01S3/0057* (2013.01); *H01S 3/10023* (2013.01); *H01S 3/2333* (2013.01); *G02B 6/2706* (2013.01); *G02B 6/272* (2013.01); *G02B 6/2766* (2013.01); *H01S 3/005* (2013.01)
 USPC .......................................... 359/341.1; 372/6

(56) References Cited

U.S. PATENT DOCUMENTS

| | | | |
|---|---|---|---|
| 4,372,644 | A | 2/1983 | Unger |
| 4,989,216 | A | 1/1991 | Chandra et al. |
| 5,675,593 | A | 10/1997 | Oka |
| 2001/0017867 | A1 | 8/2001 | Kraenert et al. |
| 2006/0210275 | A1* | 9/2006 | Vaissie et al. ............... 398/84 |
| 2009/0122818 | A1 | 5/2009 | Nettleton et al. |
| 2011/0157671 | A1* | 6/2011 | Koplow ..................... 359/238 |

FOREIGN PATENT DOCUMENTS

| | | |
|---|---|---|
| DE | 29 45 466 | 5/1981 |
| EP | 0 331 303 | 9/1989 |
| EP | 0 821 453 | 1/1998 |

OTHER PUBLICATIONS

"Chapter 4: The Intensity-dependent refractive index (pp. 190-203)" in: Robert W. Boyd: "Nonlinear Optics, $2^{nd}$ Edition," 2003, Academic Press, XP002659653, pp. 190-203.

N. Minkovski et al.: "Nonlinear optical transformation of the polarization state of circularly polarized light with holographic-cut cubic crystals," SPIE, Proc. of International Conference on Ultrafast and Nonlinear Optics 2009, vol. 7501, 75010-M, Sep. 2009, pp. 75010-M1-75010-M6, XP040515107.

Damian N. Schimpf, Enrico Seise, Tino Eidam, Steffen Hädrich and Jens Limpert: "Advantage of circularly polarized light in nonlinear fiber-amplifiers," SPIE, Proc. of Fiber Lasers VII: Technology, Systems and Applications, vol. 7580, 75802E, Jan. 2010, pp. 75802E-1-75802E-8, XP040517654.

* cited by examiner

DEVICE FOR AMPLIFYING AND/OR TRANSPORTING ELECTROMAGNETIC RADIATION

CROSS REFERENCE TO RELATED APPLICATIONS

This application is the National Stage of PCT/EP2010/004187 filed on Jul. 9, 2010, which claims priority under 35 U.S.C. §119 of German Application No. 10 2009 032 803.3 filed on Jul. 10, 2009, the disclosure of which is incorporated by reference. The international application under PCT article 21(2) was not published in English.

The invention relates to a device for amplification and/or transport of electromagnetic radiation, having a radiation source for production of the electromagnetic radiation, as well as an amplifier for amplification or a medium for transport of the produced electromagnetic radiation, respectively.

Such devices are known and find use, for example, in the production of high-energy laser radiation. The quality of the electromagnetic radiation is generally impaired in the amplification and/or transport of same, due to the occurrence of dispersion and/or non-linear effects. While the influence of dispersion can generally be compensated well, non-linear effects cause a clear worsening in the quality of the laser radiation. The dominant non-linear effect, in this connection, is the Kerr effect. This shows itself, for example, in the form of self-phase modulation. Among other things, the Kerr effect is proportional to the peak intensity and to the interaction length in the amplifier or transport medium, respectively. In order to reduce the influence of the Kerr non-linearity, it is known to use time-stretched laser pulses, also called chirped laser pulses, for the production of ultra-short laser pulses, and to subsequently amplify these chirped laser pulses. This method finds use in the so-called CPA systems (Chirped Pulse Amplification), in which the amplified laser pulses are finally also time-compressed, in most cases. Furthermore, it is known to control the non-compressed phase caused by non-linear effects, using pulse forming.

The consequences of the non-linear effects already occur in optical fibers at very low powers, because the laser radiation is guided in the form of modes. On the one hand, the laser radiation is bound to small mode field areas, which leads to high intensities; on the other hand, the laser radiation spreads in quasi-refraction-free manner, which in turn leads to great interaction lengths. Because self-phase modulation is inversely proportional to the mode field area and proportional to the fiber length, the use of new types of micro-structured fibers, such as, for example, LMA fibers (Large Mode-Area Fibers) or LMA-PCF fibers (Large Mode-Area Photonic Crystal Fiber) can greatly reduce the influence of non-linear effects, at a simultaneously small fiber length.

It is a disadvantage of the known methods for reducing the non-linear effects that relatively complicated and cost-intensive structural changes have to be made in existing devices, in order to obtain the desired result. The adaptation of the individual components to one another that is connected with these changes is also relatively complicated.

Proceeding from this, it is the task of the invention to make available a device for amplification and transport, respectively, of electromagnetic radiation, which device offers a possibility for reduction of the influence of non-linear effects that can be implemented in very simple manner and is cost-advantageous.

This task is accomplished, proceeding from a device of the type stated initially, in that the electromagnetic radiation that propagates in the amplifier or transport medium, respectively, is not polarized in linear manner, to a great extent.

The invention is based on the recognition that the coefficient of the non-linear index of refraction depends on the polarization of the electromagnetic radiation. This coefficient is approximately 1.5 times as great, in the case of linearly polarized electromagnetic radiation, as in the case of circularly polarized electromagnetic radiation. Therefore, non-linear effects such as self-phase modulation, cross-phase modulation, self-focusing, four-wave mixing, and the like can be reduced by means of the approach according to the invention. The approach, according to the invention, for reducing non-linear effects, is comparatively simple and can furthermore be incorporated into existing systems without having to make complicated structural modifications. Furthermore, the approach according to the invention can be combined, almost without problems, with the conventional methods of procedure for reducing non-linear effects described above. In this connection, it is advantageous, among other things, that a reduction in the non-linear effects leads to an increase in the peak power of the electromagnetic radiation. Furthermore, the threshold for self-focusing can be shifted upward.

Preferably, the electromagnetic radiation propagating in the amplifier or in the transport medium, respectively, is elliptically polarized. Particularly preferably, the electromagnetic radiation propagating in the amplifier or in the transport medium, respectively, is circularly polarized.

According to an advantageous embodiment of the invention, it is provided that the radiation source produces linearly polarized electromagnetic radiation, and that a polarization transformer is disposed in the beam path between the radiation source and the amplifier or transport medium, respectively. In this connection, the polarization transformer promotes transformation of the linearly polarized electromagnetic radiation in such a manner that the electromagnetic radiation propagating in the amplifier or transport medium, respectively, is not linearly polarized, to a great extent.

The amplifier or the transport medium, respectively, for example an optical glass fiber, imposes a non-linear phase, brought about by non-linear effects, on the electromagnetic radiation. This phase can be clearly reduced by means of the approach according to the invention, in simple manner, in order to thereby increase the quality or the power, respectively, of the amplified electromagnetic radiation.

The polarization transformer is preferably configured as a quarter-wave plate. This represents a very simple and cost-advantageous implementation possibility.

According to another advantageous embodiment of the invention, the polarization state of the electromagnetic radiation propagating in the amplifier or transport medium, respectively, is determined by the position r>0.9, on the one hand, and by |ϵ|>30°, |ϵ|>35°, or |ϵ|>40°, on the other hand, on the Poincaré sphere. The selection of one of these polarization states has proven to be particularly suitable for reducing the non-linear effects. However, other polarization states could also be selected, which are ideally tailored to the application case, in each instance. To make the parameter selection clear, reference is made to the Poincaré sphere shown in FIG. 5, in which linearly polarized electromagnetic radiation is located at the equator, while circularly polarized electromagnetic radiation can be found at the poles.

Another advantageous embodiment of the invention provides that the amplifier or the transport medium, respectively, has an optical isotropic medium, to a great extent. Preferably, this medium is a wave guide, a crystal, particularly a YAG crystal, an amorphous material, or a gas. The approach, according to the invention, for reducing the non-linear effects has proven to be particularly effective and advantageous for such media.

According to another advantageous embodiment of the invention, the electromagnetic radiation is formed from pulsed electromagnetic radiation pulses or from a continuous electromagnetic radiation. The occurrence of non-linear effects can be found in both types of electromagnetic radiation. The reduction of the non-linear effects, according to the invention, finds use equally with both types of radiation, and leads to similarly good results.

According to another advantageous embodiment of the invention, a polarization splitter is disposed in the beam path between radiation source and polarization transformer, and a mirror follows the amplifier, whereby the mirror reverses the radiation direction of the amplified electromagnetic radiation. In this embodiment of the invention, the use of a radiation source that produces linearly polarized electromagnetic radiation is advantageous. The electromagnetic radiation that is produced is first passed through the polarization splitter, for example a polarization splitter cube, and subsequently transformed into non-linearly polarized electromagnetic radiation, by means of the polarization transformer. This radiation is subsequently amplified by means of the amplifier, for example a fiber amplifier. In this connection, non-linear effects can occur in the amplifier, which effects can be clearly reduced by means of the selection, according to the invention, of the electromagnetic radiation propagating in the amplifier, which radiation is not linearly polarized, to a great extent. The amplified electromagnetic radiation, which is not linearly polarized, to a great extent, is subsequently reflected back at the mirror, and is once again amplified by means of the amplifier, whereby very slight non-linear effects also occur during this second amplification stage, because of the selection of electromagnetic radiation that is not linearly polarized, to a great extent. The twice amplified electromagnetic radiation, which is not linearly polarized, to a great extent, subsequently passes through the polarization transformer once again and becomes amplified, linearly polarized electromagnetic radiation, the polarization plane of which stands perpendicular to that of the initial non-amplified, linearly polarized electromagnetic radiation. The twice amplified, linearly polarized electromagnetic radiation is finally uncoupled from the device for its further use, by way of the polarization splitter. This embodiment of the invention is therefore very effective, while having a relatively compact structure.

Alternatively, it is proposed that a further polarization transformer, which transforms the electromagnetic radiation, which is not linearly polarized, to a great extent, into linearly polarized electromagnetic radiation, follows the amplifier. In this embodiment, the electromagnetic radiation passes through the amplifier only once.

It is furthermore proposed that a stretcher for temporal stretching of the electromagnetic radiation pulses is disposed in the beam path between polarization transformer and amplifier, and that the amplifier or the further polarization transformer, respectively, is followed by a compressor for compressing the amplified electromagnetic radiation pulses. This embodiment of the invention relates to the implementation of the idea of the invention in a CPA system, with the advantages connected with this.

Furthermore, it is proposed that a stretcher for temporal stretching of the electromagnetic radiation pulses is disposed in the beam path between radiation source and amplifier, and that the amplifier or the further polarization transformer, respectively, is followed by a compressor for temporal compression of the amplified electromagnetic radiation pulses.

Furthermore, it is proposed that the device is set up for spectral forming of the electromagnetic radiation pulses.

Thus, a device is made available with the invention, which serves for reducing non-linear effects in the amplification and/or the transport of electromagnetic radiation, in very simple and cost-advantageous manner, and, at the same time, can be combined, without problems, with existing devices and with other methods for reducing non-linear effects.

Figure 2:
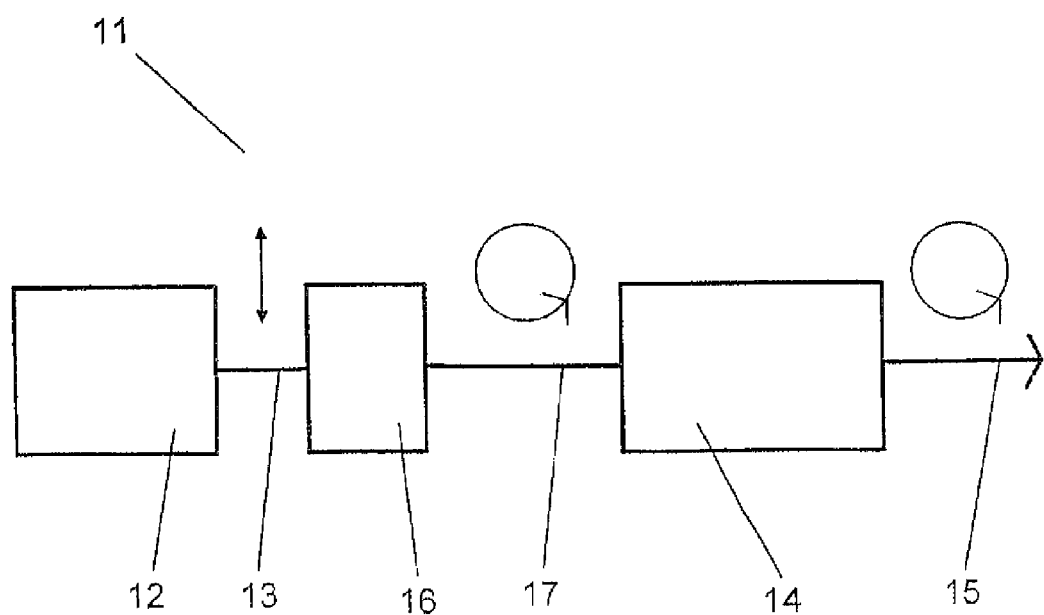
Figure 3:
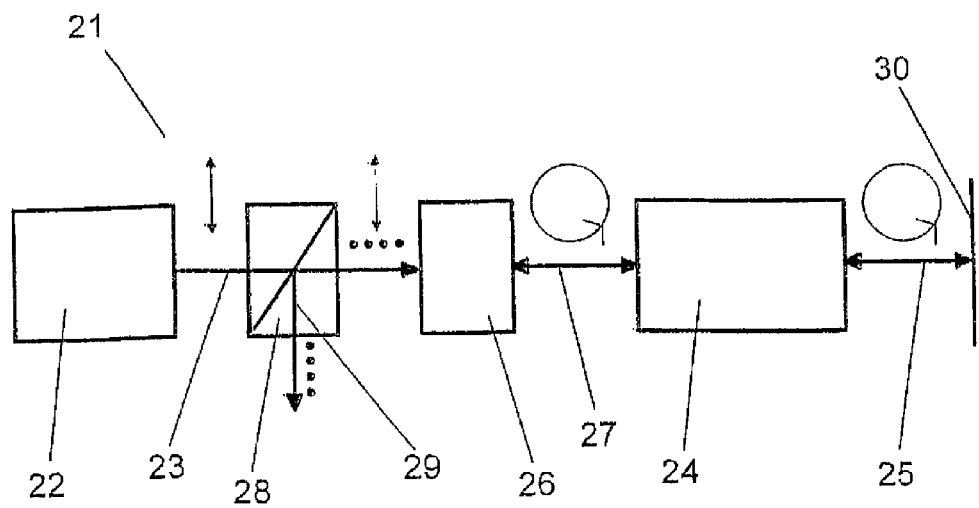
Figure 4:
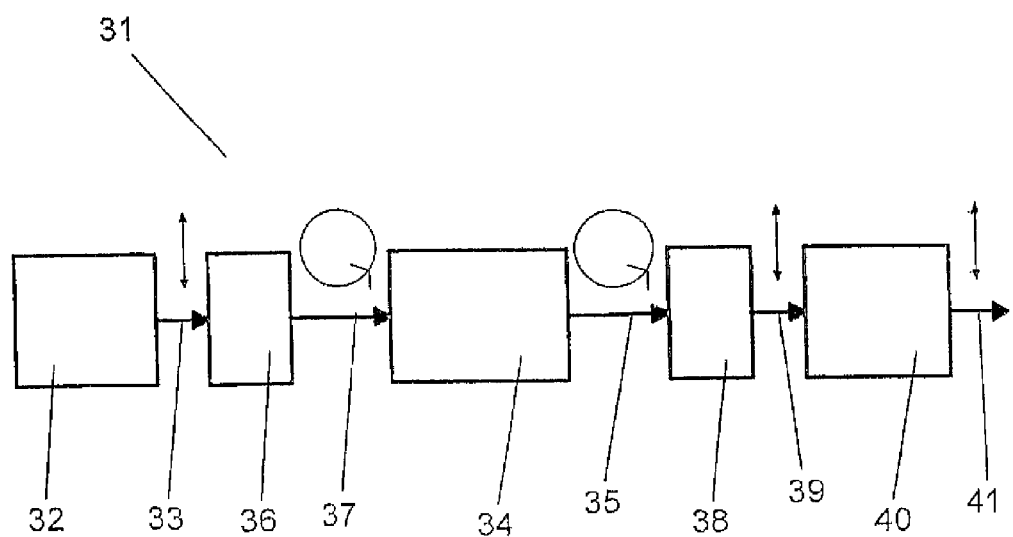
Figure 5:
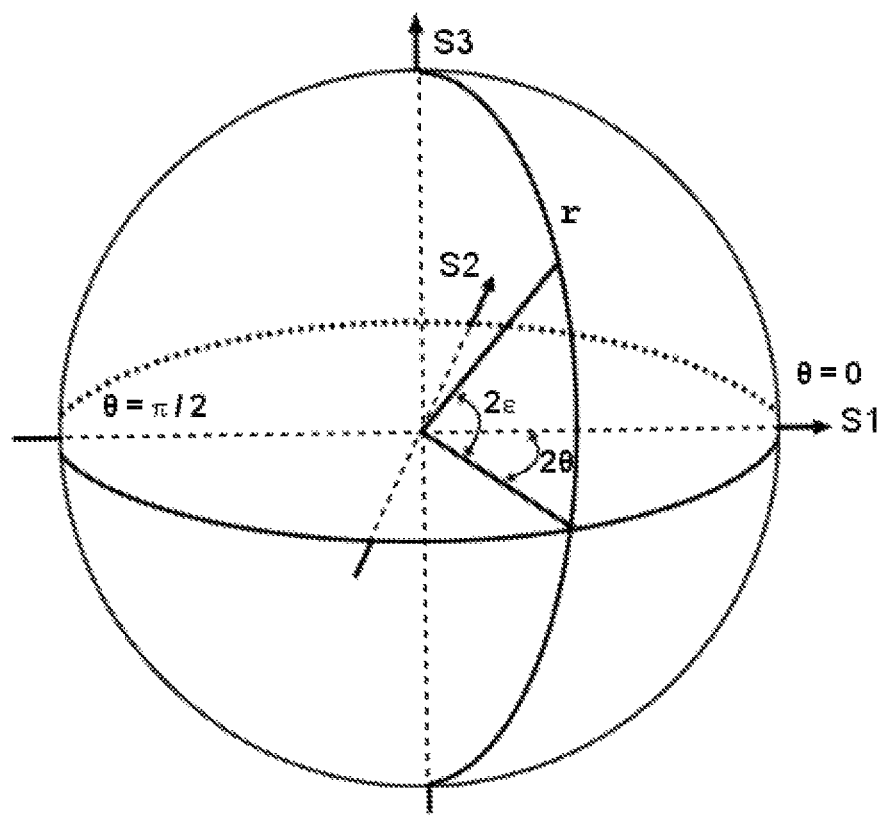

Further advantages and characteristics of the present invention will be explained in greater detail using the exemplary embodiments shown in the figures. These show:

FIG. 1: an exemplary embodiment for the device according to the invention,

FIG. 2: another exemplary embodiment for the device according to the invention,

FIG. 3: another exemplary embodiment for the device according to the invention,

FIG. 4: another exemplary embodiment for the device according to the invention, and FIG. 5: a representation of the Poincaré sphere.

FIG. 1 shows a first exemplary embodiment for the device 1 according to the invention. This has a radiation source 2 that produces electromagnetic radiation that is not linearly polarized, to a great extent, in the form of circularly or elliptically polarized electromagnetic radiation 3. The circularly or elliptically polarized electromagnetic radiation 3 is subsequently amplified by means of the amplifier 4. The non-linear effects that occur in this connection are clearly reduced by means of the use of circularly or elliptically polarized electromagnetic radiation 3.

FIG. 2 shows another exemplary embodiment for the device 11 according to the invention. This has a radiation source 12 for producing linearly polarized electromagnetic radiation 13. The linearly polarized electromagnetic radiation 13 is subsequently transformed to circularly or elliptically polarized electromagnetic radiation 17 by a polarization transformer 16 disposed in the beam path between the radiation source 12 and the amplifier 14. The circularly or elliptically polarized electromagnetic radiation 17 is then amplified by means of the amplifier 14, whereby amplified circularly or elliptically polarized electromagnetic radiation 15 is formed. This embodiment of the device 11 according to the invention can be used as an alternative to the one shown in FIG. 1.

FIG. 3 shows another exemplary embodiment for the device 21 according to the invention. In this embodiment, a radiation source 22 is used, which produces linearly polarized electromagnetic radiation 23. This linearly polarized electromagnetic radiation 23 is subsequently passed through a polarization splitter 28, which is transparent for linearly polarized electromagnetic radiation 23 in the polarization state such as that produced by the radiation source 22. The linearly polarized electromagnetic radiation 23 that the polarization splitter 28 allows to pass through is subsequently transformed to circularly or elliptically polarized electromagnetic radiation 27 by means of the polarization transformer 26. This circularly or elliptically polarized electromagnetic radiation 27 is subsequently amplified by means of the amplifier 24. The amplified circularly or elliptically polarized electromagnetic radiation 25 is subsequently reflected at a mirror 30 that reverses the radiation direction of the amplified circularly or elliptically polarized electromagnetic radiation 25. The reflected amplified circularly or elliptically polarized electromagnetic radiation 25 is again amplified by the amplifier 24 and subsequently transformed to linearly polarized electromagnetic radiation 29 by means of the polarization transformer 26; however, the polarization plane of this radiation is perpendicular to the plane of the original linearly polarized electromagnetic radiation 23 produced by the radiation source 22, as is supposed to be indicated with the dots and arrows. The twice amplified linearly polarized electromagnetic radiation 29 is subsequently uncoupled from the device 21 by way of the polarization splitter 28.

Another embodiment of the device 31 according to the invention is shown in FIG. 4. In this embodiment, the radiation source 32 produces dispersively stretched linearly polarized electromagnetic radiation 33. Instead, however, it can be provided that the radiation source produces linearly polarized electromagnetic radiation, which is subsequently dispersively stretched by means of a stretcher that follows the radiation source in the beam path. The dispersively stretched linearly polarized electromagnetic radiation 33 is subsequently transformed to dispersively stretched circularly or elliptically polarized electromagnetic radiation 37, by means of the polarization transformer 36. This radiation is thereupon amplified by means of the amplifier 34. The amplified dispersively stretched circularly or elliptically polarized electromagnetic radiation 35 is transformed back to dispersively stretched linearly polarized electromagnetic radiation 39, by means of the further polarization transformer 38 that follows the amplifier 34. This radiation is finally temporally compressed by means of a compressor 40, which allows emission of high-energy linearly polarized electromagnetic radiation 41 of high quality.

The exemplary embodiments described using the figures serve for an explanation and are not restrictive.

The invention claimed is:

1. A device for amplification and/or transport of electromagnetic radiation, having a radiation source for production of the electromagnetic radiation, as well as an amplifier for amplification or a medium for transport of the produced electromagnetic radiation, respectively, wherein the electromagnetic radiation that propagates in the amplifier or medium, respectively, is polarized,
   wherein the linear component of the polarization is substantially zero,
   wherein the electromagnetic radiation propagating in the amplifier or in the medium, respectively, is elliptically polarized,
   wherein the polarization state of the elliptically polarized electromagnetic radiation is determined by the position r>0.9, on the one hand, r denoting the degree of polarization, and by $|\epsilon|>30°$, $|\epsilon|>35°$, or $|\epsilon|>40°$, on the other hand, $\epsilon$ denoting the ellipticity, on the Poincaré sphere.

2. The device according to claim 1, wherein the radiation source produces linearly polarized electromagnetic radiation and wherein a polarization transformer is disposed in the beam path between the radiation source and the amplifier or medium, respectively.

3. The device according to claim 1, wherein the amplifier or the medium, respectively, imposes a non-linear phase, brought about by non-linear effects, on the electromagnetic radiation.

4. The device according to claim 2, wherein the polarization transformer is a quarter-wave plate.

5. The device according to claim 1, wherein the amplifier or the medium, respectively, has an optical isotropic medium.

6. The device according to claim 5, wherein the optical isotropic medium is a wave guide, a crystal, an amorphous material, or a gas.

7. The device according to claim 1, wherein the electromagnetic radiation is formed from pulsed electromagnetic radiation pulses or from a continuous electromagnetic radiation.

8. The device according to claim 2, wherein a polarization splitter is disposed in the beam path between radiation source and polarization transformer, and a mirror follows the amplifier, wherein the mirror reverses the radiation direction of the amplified electromagnetic radiation.

9. The device according to claim 1, wherein a further polarization transformer, which transforms electromagnetic radiation that is not linearly polarized, to a great extent, into linearly polarized electromagnetic radiation, follows the amplifier or medium, respectively.

10. The device according to claim 7, wherein a stretcher for temporal stretching of the electromagnetic radiation pulses is disposed in the beam path between polarization transformer and amplifier, and wherein the amplifier or the further polarization transformer respectively, is followed by a compressor for temporal compression of the amplified electromagnetic radiation pulses.

11. The device according to claim 7, wherein a stretcher for temporal stretching of the electromagnetic radiation pulses is disposed in the beam path between radiation source and amplifier, and wherein the amplifier or the further polarization transformer, respectively, is followed by a compressor for temporal compression of the amplified electromagnetic radiation pulses.

12. The device according to claim 7, wherein it is set up for spectral forming of the electromagnetic radiation pulses.

* * * * *